United States Patent
Kandah et al.

(10) Patent No.: US 9,608,623 B1
(45) Date of Patent: Mar. 28, 2017

(54) SYSTEM AND METHOD FOR MONITORING VOLTAGE ACROSS ISOLATION BARRIER

(71) Applicant: Freescale Semiconductor, Inc., Austin, TX (US)

(72) Inventors: Ibrahim Kandah, Austin, TX (US); Kim Gauen, Austin, TX (US); Neil Krohn, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/198,651

(22) Filed: Jun. 30, 2016

(51) Int. Cl.
| | |
|---|---|
| H03K 17/687 | (2006.01) |
| H03K 17/567 | (2006.01) |
| H02M 7/537 | (2006.01) |
| H02P 31/00 | (2006.01) |
| G01R 15/14 | (2006.01) |
| G01R 19/00 | (2006.01) |

(52) U.S. Cl.
CPC ......... *H03K 17/567* (2013.01); *G01R 15/144* (2013.01); *G01R 19/0084* (2013.01); *H02M 7/537* (2013.01); *H02P 31/00* (2013.01)

(58) Field of Classification Search
CPC .............. H03K 17/567; G01R 15/144; G01R 19/0084; H02M 7/537; H02P 31/00
USPC ... 327/432, 427, 434, 437, 11, 86, 168, 177, 327/190, 304, 443, 108–112; 326/82, 83, 326/87
See application file for complete search history.

(56) References Cited

U.S. PATENT DOCUMENTS

| 6,011,416 A * | 1/2000 | Mizuno .............. H03K 17/0822 327/108 |
| 7,274,241 B2 * | 9/2007 | Ho .......................... H02M 1/44 327/170 |
| 2003/0085750 A1* | 5/2003 | Herzer .................. H02M 7/538 327/434 |
| 2016/0043713 A1* | 2/2016 | Okuda ................. H03K 17/302 327/432 |

OTHER PUBLICATIONS

ACPL-782T Automotive Isolation Amplifier with R2 Coupler Isolation Data Sheet, Avago Technologies, pp. 1-18, Mar. 23, 2011.

* cited by examiner

*Primary Examiner* — Lincoln Donovan
*Assistant Examiner* — Thomas Skibinski
(74) *Attorney, Agent, or Firm* — Charlene R. Jacobsen (57) ABSTRACT

Systems and methods relating to voltage monitoring across isolation barriers are disclosed herein. In one example embodiment, an isolation system includes a low voltage circuit portion including a first control logic portion, and a high voltage circuit portion including a second control logic portion and an analog-to-digital converter portion. The system further includes a first transistor device having a first terminal coupled at least indirectly to a first connection having a first voltage level and a second terminal coupled at least indirectly to a second connection having a second voltage level. The first control logic portion governs provision of an output signal generated based at least indirectly upon the second voltage level. Due to a galvanic barrier, the output signal can be provided for receipt by another device in a manner that avoids exposure of that device to an undesirably high current or power level.

20 Claims, 4 Drawing Sheets

FIG. 5

SYSTEM AND METHOD FOR MONITORING VOLTAGE ACROSS ISOLATION BARRIER

CROSS-REFERENCE TO RELATED APPLICATIONS

--

STATEMENT REGARDING FEDERALLY SPONSORED RESEARCH OR DEVELOPMENT

--

FIELD OF THE DISCLOSURE

The present disclosure relates to systems and methods for allowing or enabling communications across isolation barriers such as galvanic isolation barriers, and more particularly to systems and methods for allowing for voltage levels to be monitored across such isolation barriers.

BACKGROUND OF THE DISCLOSURE

A variety of systems employ isolation barriers such as galvanic isolation barriers that limit or preclude the flow of current, power, or other quantities or signals across those barriers. Yet in some such systems, it is still desired that the isolation barriers permit certain types of quantities or signals to pass across those barriers including, for example, signals communicating information that can be employed for control or monitoring purposes.

For example, some systems employ a combination of a low-power control module such as a microprocessor along with a high-power device such as a motor controller. In such systems, even though it may be desirable for the low-power control module to be shielded from exposure to the high current or power levels that are present in the high-power device, it may also be desirable for communications between the low-power control module and high-power device to be permitted so as to allow for monitoring and control of the high-power device by the low-power control module.

Notwithstanding the capabilities afforded by conventional systems, to achieve such communications across isolation barriers, many conventional systems require special characteristics or features. For example, in some systems such as those mentioned above involving low-power control modules and high-power devices, communications of measured DC link voltages associated with operation of the high-power devices are achieved by way of dedicated isolated analog-to-digital converter devices and associated power supply and/or support circuitry (including, further for example, dedicated pins for each P and N terminal from power module to gate drive board).

For these and/or other reasons it would be advantageous if improved systems or methods for allowing or enabling communications across isolation barriers could be achieved.

DETAILED DESCRIPTION

The present disclosure relates to systems and methods for allowing or enabling communications across isolation barriers such as galvanic isolation barriers. More particularly, the present disclosure relates to systems and methods for allowing for voltage levels to be monitored across such isolation barriers and, in at least some embodiments, for monitoring a DC Link voltage without the need for a dedicated pin for each terminal (P and N) from power module to gate drive board. In at least some additional embodiments, the methods encompassed herein include the ability to monitor or measure the DC Link voltage (for either motor control or general system health purposes) and to report the monitored/measured DC Link voltage across an isolation barrier without the need for additional isolation channels or any dedicated isolated or standalone analog-to-digital (A2D) converter (ADC) device, or any associated power supply or support circuitry. Additionally, in at least some embodiments encompassed herein, monitoring of the DC Link voltage is achieved via the Phase output of a controller device that can be, in at least some such embodiments, an inverter. The Phase output voltage on one or more (e.g., all three) phases can be utilized. Considering the low side driver of each phase, when the high side of a bridge is on, or during recirculation, the Phase output will be very close to the DC Link voltage.

Further, in at least some embodiments, the monitoring is achieved through the use of an integrated circuit that serves to drive and protect each insulated-gate bipolar transistor (IGBT). The integrated circuit particularly includes an A2D convertor to monitor IGBT die temp, and an auxiliary A2D input is used to monitor the Phase output (via an emitter sense pin for each high side). Depending on the state of its input and that of an opposing switch in the bridge, control logic of the integrated circuit recognizes when an A2D reading on the Phase output is appropriate and operates to transfer the information over the isolation barrier to a microprocessor control side. More particularly, in at least some such embodiments, the integrated circuit is an isolated gate driver integrated circuit having on-board galvanic isolation, an on-board A2D converter on a high voltage (HV) side of the integrated circuit, an auxiliary A2D input on the HV side, and control logic on both the HV side and a low voltage (LV) side of the integrated circuit to manage A2D conversion timing. Further, in such embodiments, an off-board resistor divider is provided from the DC Link (or emitter sense high side) to the auxiliary A2D input. PWM control is provided on the LV side to report the A2D result, and allows for multiplexing A2D results from two different sources.

Figure 1:
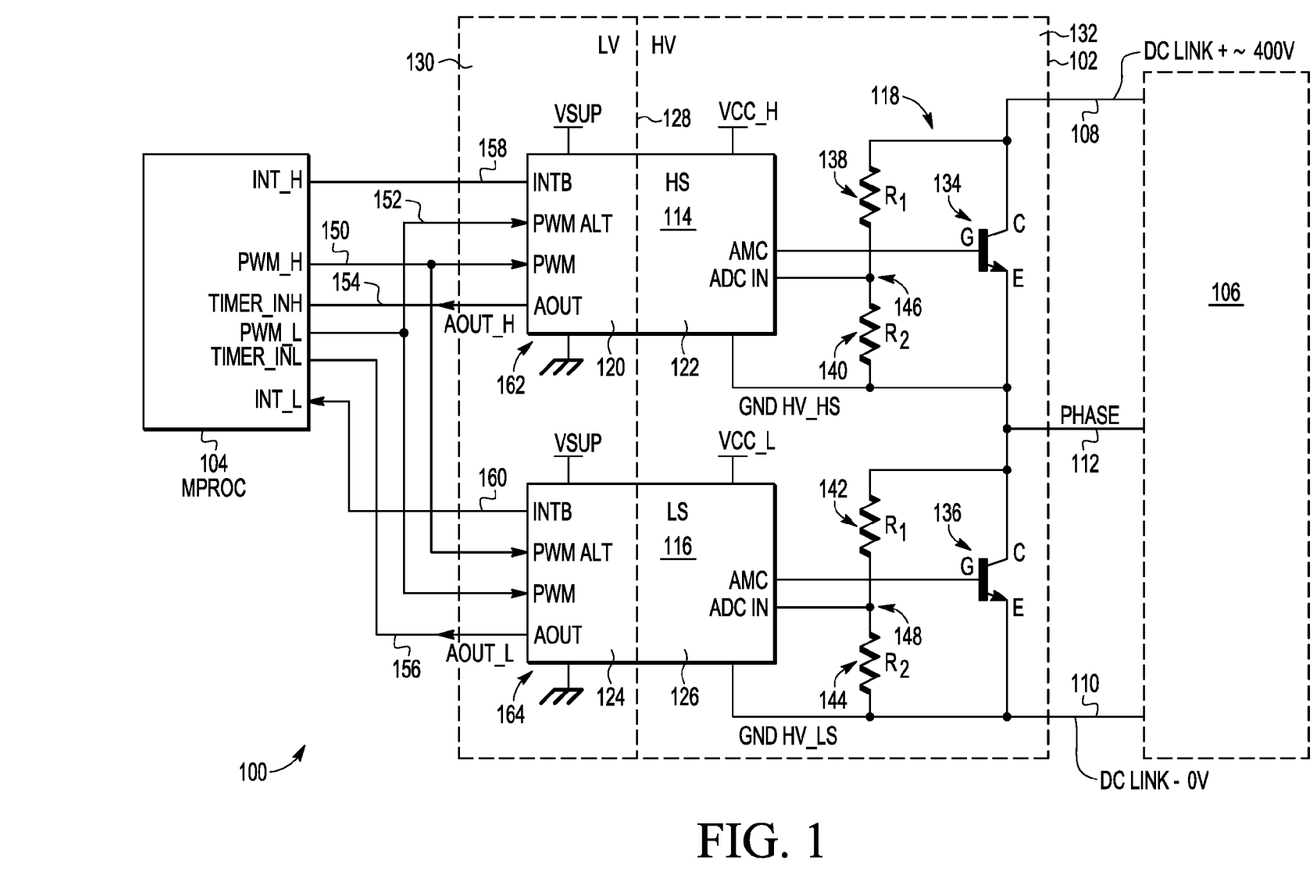
FIG. 1 is a schematic diagram illustrating example components of a system in accordance with an embodiment of the present disclosure.

Referring to FIG. 1, a schematic diagram is provided to show an example system 100 that can be referred to as a switch status detection system, in accordance with one example embodiment encompassed herein. The system 100 includes an isolation system (or circuit) 102, a microprocessor 104, and a controlled device 106. The isolation system 102 allows for communications to occur between the microprocessor 104 and the controlled device 106, while at the same time galvanically isolating the microprocessor from the controlled device so as to shield the microprocessor from excessive currents or power flow that might otherwise occur from or in relation to the controlled device. In the present embodiment, the controlled device 106 is a motor control device that is configured to receive, as inputs, a DC Link+ input via a first connection 108, a DC Link− input via a second connection 110, and a Phase output via a third connection 112. In the present embodiment, the DC Link+ input can take on a value of approximately 400 Volts, and the DC Link− input can take on a value of approximately zero volts, although in other embodiments these inputs can take on other values. For the present embodiment in which the controlled device 106 is a motor control device, the DC Link input voltage signals can be considered the supply on the motor controller (or even on the motor) itself, and can govern for example the torque of the motor.

The controlled device 106 is controlled, indirectly by way of the isolation system 102, by the microprocessor 104. Although the present embodiment employs the microprocessor 104, it should be appreciated that in other embodiments, one or more other or additional types of control units or devices or circuits can be employed including, for example, a microcomputer or an application specific integrated circuit (ASIC). Further, although the controlled device 106 in the present embodiment is a motor controller, in other embodiments it can take other forms. In order for proper control and operation of the controlled device 106 to be achieved, communication signals proceed between the microprocessor 104 and the controlled device 106. Such signals particularly allow for monitoring and control of the controlled device 106 by the microprocessor 104. The controlled device 106 however operates at high voltages, with high currents, and high power levels by comparison with the microprocessor 104, which operates at low voltages, low currents and low power levels. To avoid undesirably-high levels of current and power (and/or possibly other quantities) to reach or impact the microprocessor 104, the isolation system 102 is provided.

As shown, the isolation system 102 in the present embodiment includes a first isolated gate driver circuit or device 114, a second isolated gate driver circuit or device 116, and additional circuit components 118. In the present embodiment, each of the first and second isolated gate driver circuits 114 and 116 is a MC33GD3100 (or simply the "GD3100") integrated circuit or microchip, as is available from NXP Semiconductors MV of Eindhoven, Netherlands, and which is a BiCMOS device (an integrated circuit that combines features of a bipolar junction transistor or BJT with those of a complementary metal-oxide semiconductor or CMOS device). As will be described in relation to FIG. 2 in more detail, each of the first and second isolated gate driver circuits 114 and 116 has a respective low voltage (LV) side 120 and 124, respectively, and also has a respective high voltage (HV) side 122 and 126, respectively, where the respective LV side and respective HV side of each respective isolated gate driver circuit can be considered to be separated from one another by way of an isolation barrier 128. In the embodiment of FIG. 1, the isolation barrier 128 is illustrated as separating not only both of the respective LV sides 120 and 124 from the respective HV sides 122 and 126 of the first and second isolated gate driver circuits 114 and 116, respectively, but also as separating a LV side 130 of the isolation system 102 overall from a HV side 132 of the isolation system overall. Although in the present embodiment the isolated gate driver circuits 114 and 116 are identical GD3100 integrated circuits and are CMOS devices, in other embodiments the circuits need not be identical, or other circuits and circuit technologies can be implemented in the isolation system 102.

Further, in the present embodiment, the isolation system 102 also includes the additional circuitry 118. As shown, the additional circuit components 118 particularly includes a first transistor device 134 and a second transistor device 136. In the present embodiment, each of the first and second transistor devices 134 and 136 is an insulated gate bipolar transistor (IGBT), although in other embodiments the transistor devices can take other forms. In addition to including the first and second transistor devices 134 and 136, the additional circuit components 118 also include first, second, third, and fourth resistors 138, 140, 142, and 144, respectively. In the present example embodiment, the first and third resistors 138 and 142 have the same value $R_1$ and the second and fourth resistors 140 and 144 both have the same resistance value $R_2$, although in other embodiments the first, second, third, and fourth resistors can have other values or different values from one another. As illustrated, the first resistor 138 and second resistor 140 are coupled in series with one another between the collector (C) terminal and the emitter (E) terminal of the first transistor device 134, and the third resistor 142 and fourth resistor 144 are coupled in series with one another between the collector (C) terminal and the emitter (E) terminal of the second transistor device 136.

The additional circuit components 118 are coupled to the first and second isolated gate drivers circuits 114 and 116 as follows. In particular, the gate (G) terminal of the first transistor device 134 is coupled to an AMC pin of the first isolated gate driver circuit 114, and the gate (G) terminal of the second transistor device 136 is coupled to an AMC pin of the second isolated gate driver circuit 116. Additionally, a first node 146 forming the junction between the first and second resistors 138 and 140 is coupled to an ADC IN (or AMUX) pin of the first isolated gate driver circuit 114 and a second node 148 forming the junction between the third and fourth resistors 142 and 144 is coupled to an ADC IN (or AMUX) pin of the second isolated gate driver circuit 116. Further, the emitter (E) terminal of the first transistor device 134 is coupled to a GNDHV_HS (grounding) pin of the first isolated gate driver circuit 114 as well as to the collector (C) terminal of the second transistor device 136, and the emitter (E) terminal of the second transistor device 136 is coupled to a GNDHV_LS (grounding) pin of the second isolated gate driver circuit 116. In view of the above description, the second and third resistors 140 and 142 therefore also are coupled to the GNDHV_HS pin and the fourth resistor 144 therefore also is coupled to the GNDHV_LS pin.

It should be appreciated that the first and second resistors 138 and 140 form a resistor divider and likewise the third and fourth resistors 142 and 144 form a resistor divider. In the present embodiment, the divider ratio is scaled for the maximum expected value of the voltage experienced at the third connection 112 (or the node formed by the connection), namely, the maximum expected value of the Phase output (or PHASEU) voltage, and the maximum voltage (e.g., maximum acceptable voltage) on the ADC IN (or AMUX or AMUX IN) pin. For example, in one example embodiment in which it is expected that the DC Link+ input voltage would be 400 Volts and the maximum overshoot would be 800 Volts, then the respective resistance values $R_1$ and $R_2$ for the first and second resistors 138 and 140, respectively, can be sized (e.g., in accordance with a divide-by-160 relationship or a "div 160" relationship) so that, if the maximum overshoot of 800 Volts was experienced, then the voltage experience at the ADC IN pin ($V_{ADC}$) would be 5 Volts. Likewise, with such sizing, if the DC Link+ input voltage had a 400 Volt value, then the voltage experienced at the ADC IN pin ($V_{ADC}$) would be 2.5 Volts.

Although both resistor dividers formed by the resistors 138, 140, 142, and 144 are shown to be present in FIG. 1, it should be understood that other embodiments encompassed herein only include one or the other of these two resistor dividers—that is, in such other embodiments, only the resistors 138 and 140, or the resistors 142 and 144, but not all four of the resistors, are present. Thus, in some embodiments, the resistor divider—and particularly the node between the two resistors of the resistor divider (e.g., the first node 146 or the second node 148)—is coupled to one of the ADC IN (or AMUX or AMUX IN) pins of one of the first or second isolated gate driver circuits 114 or 116, but not both as shown in FIG. 1. In other words, an ADC IN (or AMUX or AMUX IN) pin connection relative to a resistor divider can optionally be placed on the high side (e.g., the side including the first isolated gate driver circuit 114 and configured to determine the DC Link+ input voltage) or the low side (e.g., the side including the second isolated gate driver circuit 116 and configured to determine the DC Link− input voltage) rather than both as shown in FIG. 1.

Further as shown in FIG. 1, the system 100 includes connections that couple the microprocessor 104 to the LV side 130 of the isolation system 102, to pins on the LV sides 120 and 124 of the first and second isolated gate driver circuits 114 and 116, and allow for signals to be communicated between the microprocessor and the isolation system. More particularly, the microprocessor 104 outputs pulse-width-modulation (PWM) high and low signals for receipt by the first and second isolated gate drivers circuits 114 and 116. In this regard, PWM_H signals are output by the microprocessor 104 and transmitted via a connection 150 to both a PWM pin of the first isolated gate driver circuit 114 and a PWMALT (alternate PWM) pin of the second isolated gate driver circuit 116. Further, PWM_L signals are output by the microprocessor 104 and transmitted via a connection 152 to both a PWM pin of the second isolated gate driver circuit 116 and a PWMALT (alternate PWM) pin of the first isolated gate driver circuit 114. In addition, the first isolated gate driver circuit 114 sends AOUT_H signals via a connection 154 for receipt by the microprocessor 104 at a TIMER_INH pin of the microprocessor, and the second isolated gate driver circuit 116 outputs AOUT_L signals via a connection 156 for receipt by the microprocessor at a TIMER_INL pin of the microprocessor 104. Also, interrupt signals are transmitted from an INTB pin of the first isolated gate driver circuit 114 to the microprocessor 104 via a connection 158, and from an INTB pin of the second isolated gate driver circuit 116 to the microprocessor via a connection 160.

In addition to the connections 150, 152, 154, 156, 158, and 160 between the first and second isolated gate driver circuit 114 and 116 of the isolation system 102 and the microprocessor 104, it should also be appreciated from FIG. 1 that the first and second isolated gate driver circuits 114 and 116 are additionally coupled to various power sources and to ground. More particularly, the LV side 120 of the first isolated gate driver circuit 114 is coupled to receive power from a voltage source at a voltage supply (VSUP) terminal and coupled to ground via a ground terminal 162, and the HV side 122 of the first isolated gate driver device is also coupled to a power source at a VCC_H terminal. Similarly, the LV side 124 of the second isolated gate driver circuit 116 is coupled to receive power from a voltage source at an additional voltage supply (VSUP) terminal and coupled to ground via a ground terminal 164, and the HV side 126 of the second isolated gate driver circuit is further coupled to a power source at a VCC_L terminal.

As mentioned above, the controlled device 106 is coupled to the isolation system 102 by way of the first connection 108, the second connection 110, and the third connection 112. More particularly as shown, the first connection 108 providing the DC Link+ input connects the controlled device 106 with the collector (C) terminal of the first transistor device 134 within the isolation system 102. The second connection 110 providing the DC Link− input connects the controlled device 106 with the emitter (E) terminal of the second transistor device 136. The third connection 112 providing the Phase output is coupled to each of the emitter (E) terminal on the first transistor device 134 and to the collector (C) terminal of the second transistor device 136. It should be appreciated that, although FIG. 1 shows various components and connections of the system 100, these are intended to be illustrative and representative of features of the system 100 that enable information to be communicated between the controlled device 106 and the microprocessor 104 across the isolation barrier 128 in a manner that still maintains desired isolation between the HV side 132 and LV side 130 of the isolation system 102 and thereby maintains desired isolation between the controlled device 106 and the microprocessor 104. However, it should be appreciated that other or additional components or connections or other features can be present in alternate embodiments.

Figure 2:
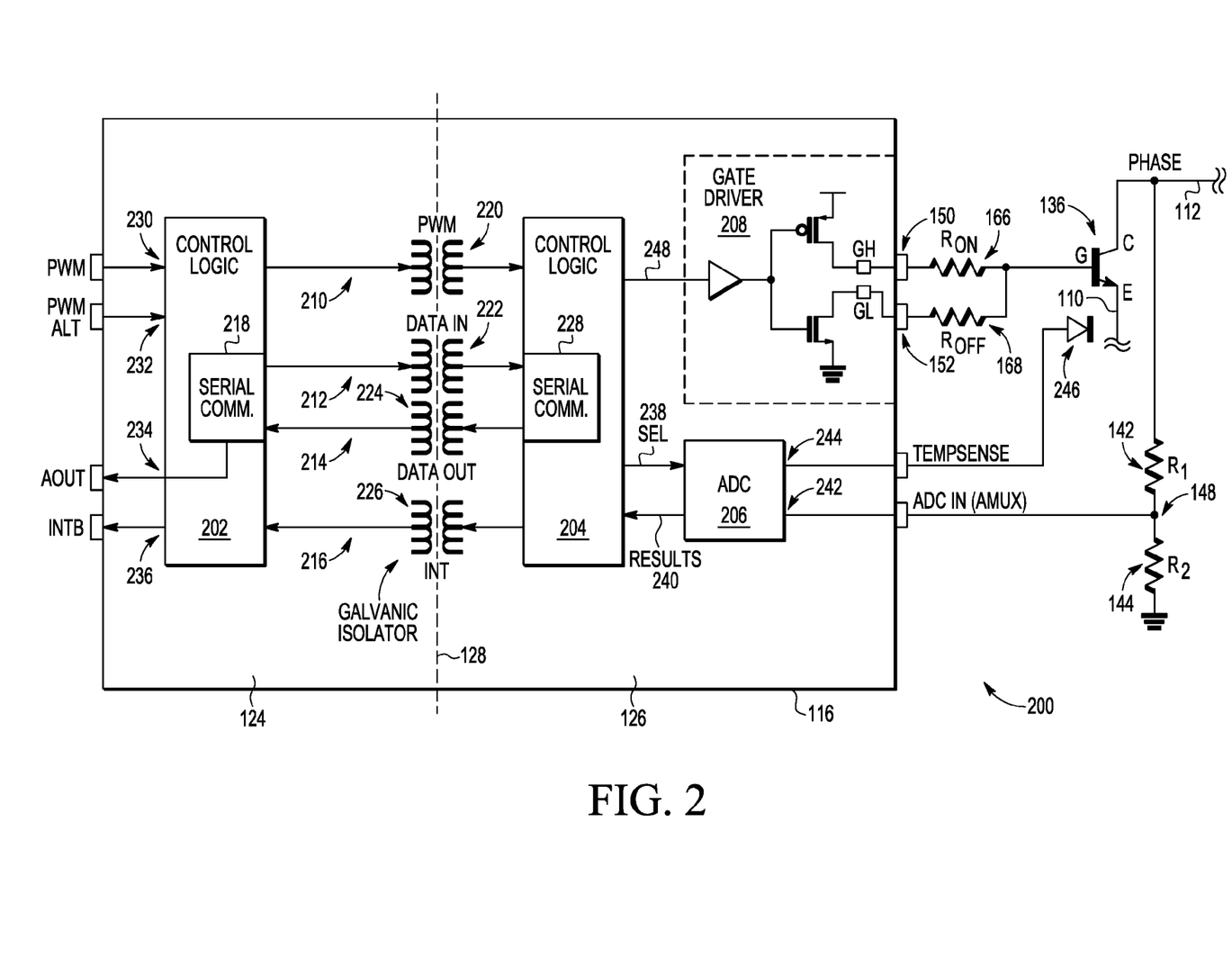
FIG. 2 is a schematic diagram illustrating in further detail several components of the system of FIG. 1 in accordance with an embodiment of the present disclosure.

Turning to FIG. 2, an additional schematic diagram is provided that shows in more detail several portions 200 of the system 100 of FIG. 1, particularly the second isolated gate driver circuit 116 and associated portions of the additional circuit components 118. The portions 200 of the system 100 shown in FIG. 2 particularly are the portions of the system 100 that can be considered the low side, in that the portions 200 serve to detect the DC Link− input voltage rather than the DC Link+ input voltage. More particularly as shown in FIG. 2, the second isolated gate driver circuit 116 includes a first control logic block (or circuit) 202 and a second control logic block 204, where the first control logic block 202 is within the LV side 124 of the circuit and the second control logic block 204 is within the HV side 126 of the gate driver circuit 116. Additionally, within the HV side 126 of the second isolated gate driver circuit 116 there is present an analog to digital (A2D) converter (ADC) block 206 and a gate driver block 208.

As discussed above, the isolation barrier 128 separates the LV side 124 of the second isolated gate driver circuit 116 from the HV side 126, such that high levels of current or power cannot flow between the two sides (and particularly from the HV side to the LV side). Nevertheless, the second isolated gate driver circuit 116 does include first, second, third, and fourth coupling channels 210, 212, 214, and 216 that couple the first control logic block 202 with the second control logic block 204. More particularly, the first, second, third, and fourth coupling channels 210, 212, 214, and 216 respectively include first, second, third, and fourth inductive coil pairs 220, 222, 224, and 226, and by virtue of these inductive coil pairs the coupling channels serve as galvanic isolators by which signals can be communicated between the control logic blocks 202 and 204 but large current or power levels are not communicated therebetween.

Further as illustrated, the first coupling channel 210 particularly is a PWM coupling channel that allows for PWM (pulse-width modulation) control signals to proceed from the first control logic block 202 across the isolation barrier 128 to the second control logic block 204. The second coupling channel 212 allows data to be communicated from a serial communications block 218 of the first control logic block 202 to a serial communications block 228 of the second control logic block 204, in the form of a DATA IN signal. The third coupling channel 214 allows data to be communicated from the serial communications block 228 of the second control logic block 204 to the serial communications block 218 of the first control logic block 202, in the form of a DATA OUT signal. The fourth coupling channel 216 by comparison allows for interrupt signals to be communicated from the second control logic block 204 across the isolation barrier 128 for receipt by the first control logic block 202.

It should be appreciated by a comparison of FIGS. 1 and 2 that the first control logic block 202 within the LV side 124 of the second isolated gate driver circuit 116 shown in FIG. 2 has first and second input terminals 230 and 232 that correspond to the PWM and PWMALT terminals of the second isolated gate driver circuit 116 as shown in FIG. 1, and also has third and fourth terminals 234 and 236 that correspond to the AOUT and INTB pins of the second isolated gate driver circuit 116 as shown in FIG. 1. Further, with respect to the I-TV side 126 of the second isolated gate driver circuit 116, the second control logic block 204 therewithin is in communication with the A2D converter block 206 both by way of a first selection connection 238 and a results connection 240. The A2D converter block 206 further includes an input terminal 242 that corresponds to the ADC IN pin described above in relation to FIG. 1 (which can also be referred to as an AMUX pin), and which is in the present embodiment coupled to the node 148 between the third and fourth resistors 142 and 144. Further, the A2D converter block 206 also includes an input terminal 244 that is coupled to a TEMPSENSE terminal (not shown in FIG. 1) that in turn is coupled to a temperature sensor 246 that can be positioned proximate to the second transistor device 136. By virtue of this arrangement, the temperature sensor 246 can sense the temperature of the second transistor device 136 and provide signals indicative thereof back to the TEMPSENSE terminal and thus to the A2D converter block 206.

As for the gate driver circuit 208, this is coupled to the second control logic block 204 by way of a connection 248 and can output signals at either a GH terminal 250 or a GL terminal 252. The GH terminal and GL terminal respectively are shown to be coupled to the gate (G) terminal of the second transistor device 136 by way of either a first resistor ($R_{ON}$) 166 or a second resistor ($R_{OFF}$) 168, which are each coupled to the gate (G) terminal of the second transistor device 136. Although not shown, the gate (G) terminal of the second transistor device 136 also can be coupled to the gate driver 208 by way of an AMC terminal as described in relation to FIG. 1, although both the GH and the GL terminals can be viewed as substitutes for the AMC terminal. It should additionally be appreciated that, although the collector (C) terminal of the second transistor device 136 is coupled to the third connection 112 providing the Phase output, the emitter (E) terminal of the second transistor device 136 is coupled to the second connection providing the DC Link− input.

Although FIG. 2 particularly shows the second isolated gate driver circuit 116, it should be appreciated that in the present embodiment the first isolated gate driver circuit 114 has components and features that are identical to those of the second isolated gate driver circuit. Further, although FIG. 2 particularly shows those of the additional circuit components 118 that are particularly affiliated with the second isolated gate driver circuit 116 (and for simplicity omits showing the coupling of the collector (C) terminal of the second transistor device 136 to the emitter (E) terminal of the first transistor device 134), it should be understood that the first isolated gate driver circuit 114 also includes an A2D convertor block identical to the A2D converter block 206 and a gate driver block identical to the gate driver block 208, and those blocks are coupled to the gate (G) terminal of the first transistor device 134 and to the junction 146 between the first resistor 138 and second resistor 140 in the same manners the A2D converter block 206 is coupled to the gate (G) terminal of the second transistor device 136 and the gate driver block 208 is coupled to the node 148. Further, with respect to the first isolated gate driver circuit 114, there is additionally present a TEMPSENSE terminal associated with the A2D converter block of that isolated gate driver circuit, by which a temperature sensor identical to the temperature sensor 246 can be coupled to that isolated gate driver circuit so as to provide temperature sensor signals regarding the temperature of the first transistor device 134.

At the same time, with respect to the implementation of the first isolated gate driver circuit 114 and associated portions of the additional circuit components 118, it should also be appreciated from FIG. 1 that the first transistor device 134 would be arranged in a manner inverted from that of the second transistor device 136 shown in FIG. 2. Namely, with respect to that implementation, the emitter (E) terminal of the first transistor device 134 will be the terminal that is coupled to the third connection 112 providing the Phase output, and the collector (C) terminal of the first transistor device will be coupled to the first connection 108 providing the DC Link+ input.

Figure 3:
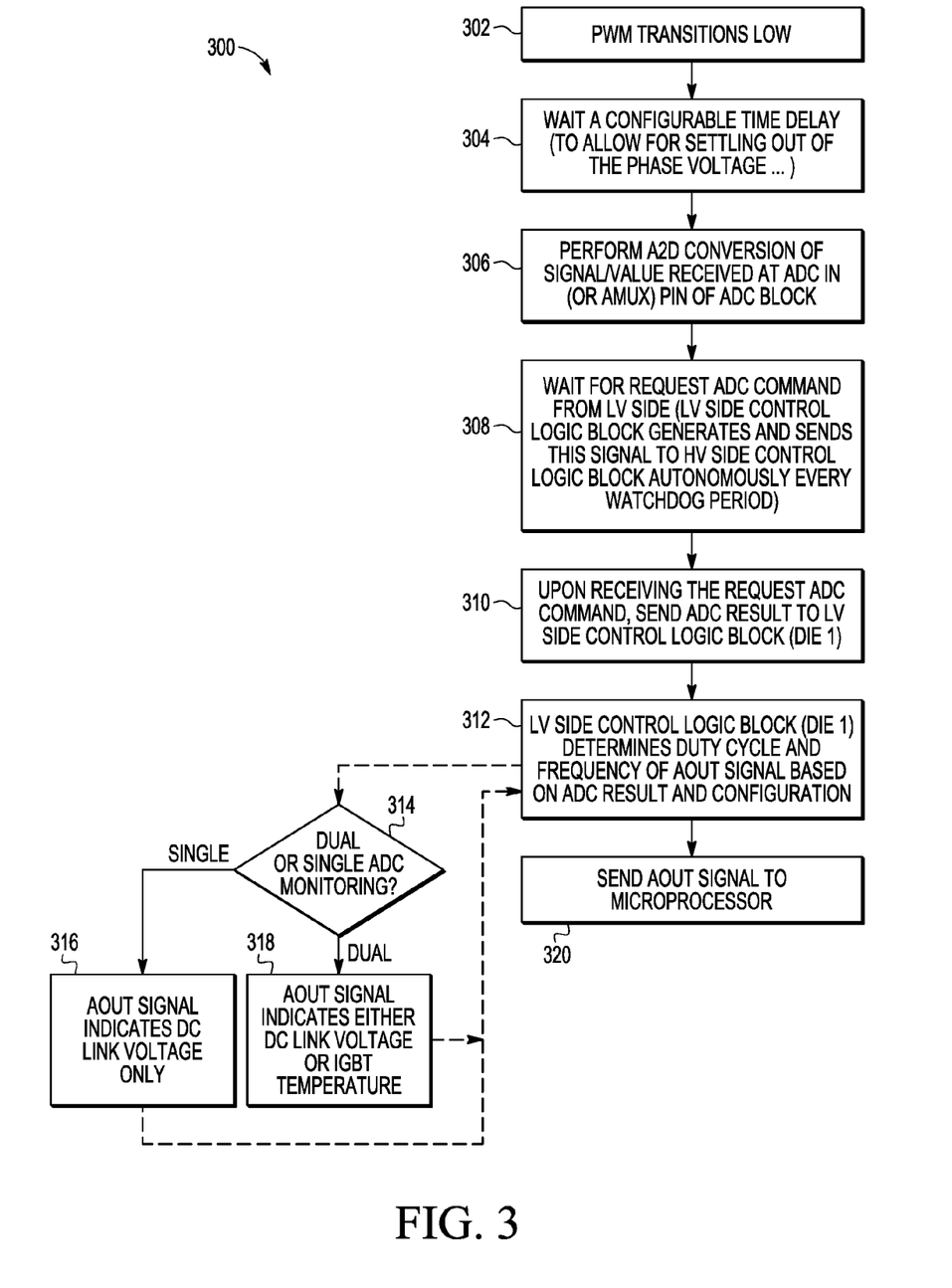
FIG. 3 is a flow chart showing example steps of an example process of operation of the system of FIGS. 1 and 2.
Figure 4:
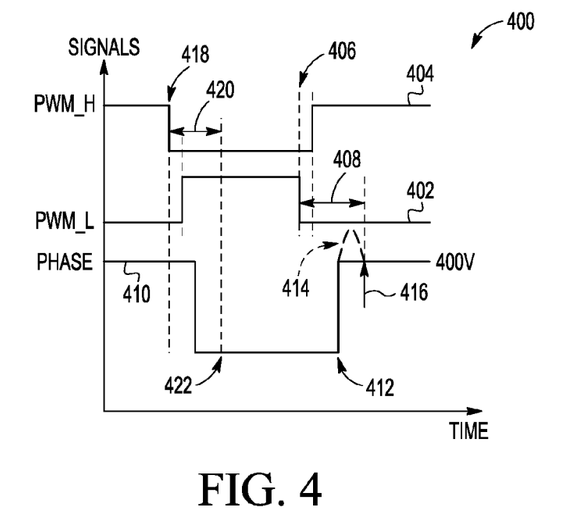
FIG. 4 is a timing diagram illustrating example signals and associated events during operation of the system of FIGS. 1 and 2 when operating in accordance with the process of FIG. 3.

Turning to FIGS. 3 and 4, a flow chart 300 shown in FIG. 3 illustrates example steps of an example process of operation of the system 100 of FIGS. 1 and 2, and a timing diagram 400 shown in FIG. 4 illustrates example signals that are transmitted within and in relation to the system 100 and the relationship of certain operations of the system to those example signals. It should be appreciated that the process represented by the flow chart 300 concerns operations involving the providing of voltage information associated with the controlled device 106 back to the microprocessor 104 by way of the isolation system 102 so as to allow for monitoring of the controlled device by the microprocessor. At the same time, as described particularly in relation to steps 312, 314, 316, 318, and 320 of the flow chart 300, the exact manner of operation can vary depending upon the embodiment or configuration of the system 100, for example, in terms of whether the providing of voltage information associated with the controlled device 106 to the microprocessor 104 is supplemented by the providing of other types of information such as temperature information.

The example steps of operation shown in FIG. 3 can particularly be viewed as steps of operation of the second isolated gate driver circuit 116 in relation to the additional circuit components 118 shown in FIG. 2, although a substantially similar process of operation can be performed by the first isolated gate driver circuit 114 in relation to the additional circuit components 118. Because the example steps of operation of FIG. 3 are described as pertinent to operation of the second isolated gate driver circuit 116, the voltage information provided back to the microprocessor 104 can be considered to be voltage information indicative of the voltage at the second connection 110 at which the DC Link− input voltage is present, and thus FIG. 3 can be viewed as directed toward low side voltage sensing. However, if the process was performed in relation to the first isolated gate driver circuit 114, then the voltage information would be indicative of the voltage at the connection 108, namely, the DC Link+ input voltage, and in that case would be directed toward high side voltage sensing.

As shown in FIG. 3, the process of operation represented by the flow chart 300 can be viewed as commencing at a step 302 at which the pulse-width modulation (PWM) signal is provided from the microprocessor 104 to the isolation system 102, particularly at the first control logic block 202 of the second isolated gate driver circuit 116. When viewed in the context of FIG. 1, it can be understood that the PWM signal received at the second isolated gate driver circuit is a PWM_L signal from the microprocessor 104 that is received at the terminal 230 (the "PWM" terminal) of the first control logic block 202 of the second isolated gate driver circuit 116. At the same time, microprocessor 104 is also typically sending a PWM_H signal that is received at the terminal 232 (the "PWMALT" terminal) of the firs control logic block 202. Thus, in FIG. 4, both an example PWM_L signal 402 and an example PWM_H signal 404 received from the microprocessor 104 are shown.

Upon the PWM signal (that is, the PWM_L signal 402) transitioning low at a time 406, the first control logic block 202 further sends a PWM signal across the coupling channel 210 for receipt by the second control logic block 204. Although this PWM signal sent across the coupling channel 210 is not independently shown in FIG. 4, it can be considered that this PWM signal is identical or substantially identical in its form and timing to the PWM_L signal 402 (although the two signals can potentially have different magnitudes). The second control logic block 204 in turn causes the second transistor device (again, for example, an IGBT) 136 to change in state, e.g., from being turned on (conductive) to turned off (non-conductive). That is, the second transistor device 136 is commanded to turn off at the same time (or substantially the same time) as the time 406.

Next, at a step 304, the second control logic block 204 waits for a configurable time delay 408 to pass relative to the time 406 at which the PWM_L 402 transitions low. As shown in FIG. 4, the time delay 408 is of appropriate length so as to allow for settling of the DC Link− input voltage at the second connection 110, and correspondingly to allow for the settling of the Phase output voltage a the third connection 112, after the transitioning in the state of the second transistor device 136 in response to the PWM signal transitioning low. More particularly, FIG. 4 illustrates how the Phase output voltage, shown as a Phase output voltage signal 410, transitions from a low level to (or toward) a high level at a time 412 subsequent to the time 406. As illustrated, although the Phase output voltage signal 410 ideally takes the form of a PWM or square wave, in practice there is a period of time subsequent to the time 412 at which settling occurs, as represented by a positive half-sinusoid signal shown by a dashed line 414. So that an accurate reading of the Phase output voltage signal 410 (and thus an accurate indication of the DC Link− input voltage) can be obtained, the time delay 408 is of sufficient length such that, upon the expiration of the time delay at a time 416, the Phase output voltage signal 410 has substantially attained a steady state or constant (or substantially constant) value.

It should be appreciated that the length of the time delay 408 can be fixed or can be configurable to vary depending upon the characteristics of the second transistor device 136, characteristics of the controlled device 106, or other characteristics. Also, the length of the time delay 408 can take into account the magnitude of the expected steady state value of the Phase output voltage (or DC Link− input voltage), which in the present example embodiment is shown to be 400 Volts. In one example embodiment, the time delay 408 equals or approximates 700 nanoseconds after the PWM signal transitions low (that is, after a turnoff command is provided).

Next, at a step 306, a reading is taken at the A2D converter block 206 of the signal or value received at the input terminal 242, which is the ADC IN (or AMUX) pin of the A2D converter block 206, and A2D conversion is performed upon that signal or value to obtain a digital representation of that signal or value. With respect to FIG. 4, the performing of the step 306 can coincide with the time 408 at which the time delay 408 (following the time delay 406) has passed, or the performing of the step 306 can occur subsequent to the time 408 after the Phase output voltage signal 410 has stabilized at its steady state value (again, for example, 400 Volts). As shown in FIG. 2, the signal or value received at the input terminal 242 is equal to the voltage at the node 148 between the third and fourth resistors 142 and 144. The voltage at the node 148 is reflective of the value of the Phase output voltage present at the third connection 112, which is indicative of the DC Link− (or DC Link+ input) voltage because, considering the low-side driver of each phase, when the high side of a bridge is on, or during recirculation, the Phase output will be very close to the DC Link voltage.

It should be appreciated that the voltage experienced at the input terminal 242 of the A2D converter block 206 is related to the voltage at the third connection 112 based upon the sizes of the third and fourth resistors of 142 and 144. For example, if the value of the third resistor 142 (R1) is 100 kiloohms and the value of the fourth resistor 144 (R2) is 400 kiloohms, then the voltage experienced at the input terminal 242 (ADC IN pin) will be equal to the sum of the DC Link− input voltage and a forward diode voltage, multiplied by 100K and divided by 500K ($V_{ADC}$=(DC Link−0.7V)(100K/500K)).

Next, at step 308, the second control logic block 204 awaits a request ADC command to be transmitted from the first control logic block 202 on the LV side 124 of the second isolated gate driver circuit 116. Although the timing/frequency of the sending of the request ADC command can vary depending upon the embodiment, in the present embodiment the first control logic block 202 on the LV side 124 generates and sends the request ADC command to the second control logic block 204 on the HV side 126 autonomously every watchdog period, and the watchdog period is 200 microseconds. The time of the request ADC command is not shown in FIG. 4, although in that example embodiment it occurs at or after the time 416.

Subsequently, at step 310, upon the request ADC command being received, the second control logic block 204 sends the ADC result received from the ADC block 206 (by way of the results connection 240) back to the first control logic block 202 of the LV side 124 of the second isolated gate driver circuit 116. In at least some embodiments, the ADC result (or A2D result) is sent to the LV side 124 as the DATA OUT signal via the third coupling channel (which again includes the third inductive coil pair 224 serving as a galvanic isolator). In some such embodiments, the ADC result can be sent in the form of a Manchester encoded serial stream. Based upon the ADC result that the first control logic block 202 receives via the DATA OUT signal, the first control logic block is in turn able to generate the AOUT signal for receipt by the microprocessor 104, where the AOUT signal takes the form of a PWM signal that communicates that ADC result to the microprocessor. That is, PWM encoding of the ADC result to generate a signal for receipt by the microprocessor 104 is done on LV side 124 of the second isolated gate driver circuit 116.

In this regard, in a step 312, the first control logic block 202 on the LV side 124 (which can also be referred to as a DIE1) determines a duty cycle and/or a frequency for the AOUT signal to be output from the first control logic block 202 to the microprocessor 104. More particularly, with respect to the arrangement of FIG. 2 involving the second isolated gate driver circuit 116, the AOUT signal is particularly the AOUT_L signal mentioned above and is output by way of the AOUT pin corresponding to the third terminal 234 of the first control logic block 202 of the second isolated gate driver circuit. Alternatively, if it is the first isolated gate driver circuit 114 that is providing the AOUT signal, the signal would particularly be the AOUT_H signal mentioned above, which can be output by way of the AOUT pin of the first isolated gate driver circuit (which, although not shown in FIG. 2, can take substantially the same form as the AOUT pin arrangement of the second isolated gate driver circuit shown in FIG. 2).

The duty cycle or frequency of the AOUT signal in any given embodiment or implementation can be determined based upon any of a variety of considerations. In at least some embodiments, the isolation system 102 (or portions thereof, such as the first control logic block 202 of the second isolated gate driver circuit 116) can take on various configurations, upon which duty cycle or frequency determinations are based at least in part. For example, as illustrated in step 314, in at least some such embodiments, the isolation system 102 can take on single or dual ADC monitoring configuration or mode. Further as illustrated, if the system 100 is configured for performing single ADC monitoring as represented by step 316 following step 314, then the AOUT signal will be configured to indicate the relevant DC Link input voltage level only (e.g., the DC Link− input voltage). However, if the system is configured for performing dual ADC monitoring, then the AOUT signal can indicate either DC link voltage or IGBT temperature as represented by step 318 and described in greater detail with respect to FIG. 5, or can indicate any other signal that is provided to (or that the user may connect to) the ADC IN (or AMUX or AMUX IN) pin.

Upon determining the duty cycle and/or frequency of the AOUT signal at the step 312 (and any associated substeps, for example, the steps 314, 316, and/or 318), then the process advances to a step 320, at which the AOUT signal containing the ADC result information is transmitted to the microprocessor 104 as a PWM encoded signal. In at least some embodiments, the duty cycle of the AOUT signal can be representative of the voltage information being communicated (e.g., the DC Link− input voltage). Again, particularly with respect to the arrangement of FIG. 2 involving the second isolated gate driver circuit 116 and low side voltage sensing, the AOUT signal is particularly the AOUT_L signal mentioned above and is output by way of the AOUT pin corresponding to the third terminal 234 of the first control logic block 202 of the second isolated gate driver circuit. Alternatively, the AOUT signal can be the AOUT_H signal mentioned above, particularly if the process of interest involves operation of the first isolated gate driver circuit 114 for performing high side sensing of the DC Link+ input voltage rather than the second gate driver circuit 116 for performing low side sensing of the DC Link− input voltage.

Further in this regard, it should be appreciated that, where the first isolated gate driver circuit 114 is employed and high side voltage sensing is performed, not only is the AOUT_H signal provided the microprocessor 104 the output signal of interest, but also it is the PWM_H signal 404 provided to the first isolated gate driver circuit that governs the timing of the process. That is, when the first isolated gate driver 114 is employed and high side voltage sensing is performed, it is the transitioning of the PWM_H signal 404 from a high value to a low value (e.g., at a time 418 as shown in FIG. 4) that ultimately precipitates transitioning in the on/off status of the first transistor device 134. Further, during such high side voltage sensing, a time delay (e.g., a time delay 420 as shown in FIG. 4) allowing for settling of the DC Link+ output voltage and Phase input voltage is measured relative to the time (again, for example, the time 418) at which the PWM_H signal 404 transitions from the high value to low value. It is upon or after expiration of that time delay (e.g., at a time 422 as shown in FIG. 4) that the step 306 involving A2D conversion and remaining steps 308-320 relating to the communication of sensed voltage information to the microprocessor 104 occur.

Additionally, although in the present embodiment the ADC (or A2D) result is sent to the microprocessor 104 via PWM encoded signal from the AOUT pin corresponding to the third terminal 234 of the first control logic block 202, in other embodiments the ADC result information or other information can be sent to the microprocessor 104 by way of other signals or in other manners. For example, in some other embodiments, the ADC result information can be output from the first control logic block 202 for receipt by the microprocessor via any of SPI, MOSI, CSB, MISO, or SCLK pins of the first control logic block.

Although FIG. 3 shows example steps of an example process of operation of the system 100 and particularly the isolation system 102, it should be appreciated that the present disclosure encompasses numerous other embodiments differing from that of FIG. 3 in any of a number of respects. For example, in some alternate embodiments encompassed herein, one or more of the steps shown in FIG. 3 are not performed and/or one or more additional steps not shown in FIG. 3 are performed. Further, although not shown, it should be understood that the process of FIG. 3 can be performed repeatedly such that the step 320 can be followed by the step 302 repeatedly.

Figure 5:
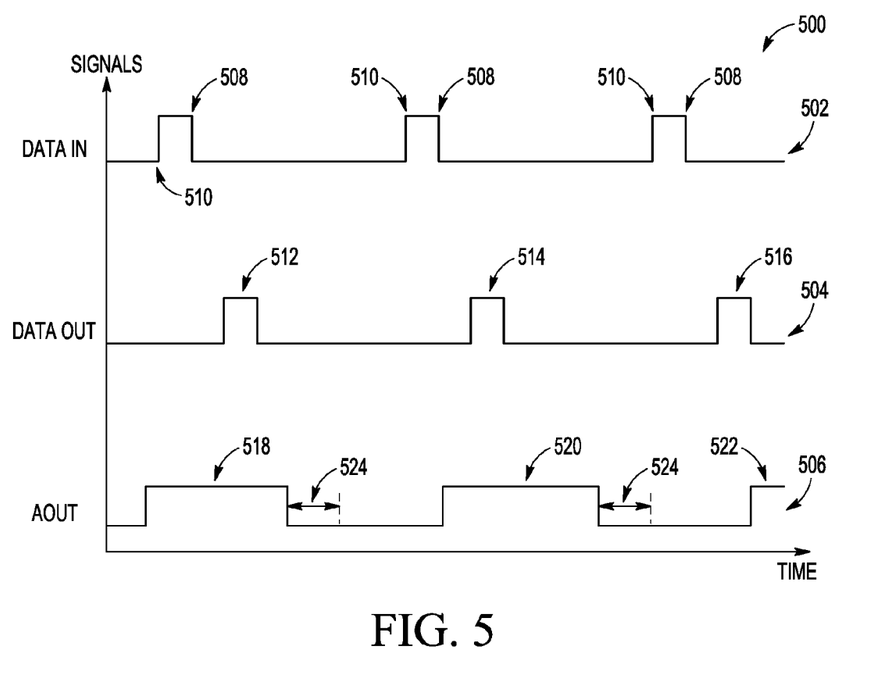
FIG. 5 is an additional timing diagram illustrating example signals and associated events during operation of an example embodiment consistent with the embodiment described in relation to FIGS. 1, 2, 3, and 4, when particularly operating in a dual monitoring capacity.

Additionally, as mentioned in regard to FIG. 3, the exact manner of operation of the system 100—and particularly the exact manner of operation of the isolation system 102 in determining the characteristics of one or more AOUT signals and outputting those signals for receipt by the microprocessor 104—can vary depending upon the configuration of the system. In this regard, an additional timing diagram 500 shown in FIG. 5 illustrates example signals that are transmitted within and in relation to the system 100 and the relationship of certain operations of the system to those example signals when the system 100 is configured in accordance with the dual ADC monitoring configuration discussed above in regard to the steps 314 and 318. That is, FIG. 5 illustrates example signals in an implementation in which the isolation system 102 operates to provide both sensed DC Link+ or DC Link− input voltage information and also temperature information regarding the temperature of an associated one of the transistor devices 134 or 136.

More particularly in this regard, FIG. 5 shows first and second Manchester encoded signals 502 and 504, respectively, and also a PWM signal 506. With respect to the first and second Manchester encoded signals 502 and 504, both of these signals also can be considered PWM signals (in the present example illustrated, each of the pulses of the signals 502 and 504 is a 24 bit data frame). More particularly, the first Manchester encoded signal 502 can be considered to represent the periodic receiving of request ADC commands at the step 310 at the HV side 132 of the isolation system 102 from the LV side 130 of the isolation system. The first Manchester encoded signal 502 can for example be a signal received at the second control logic block 204 of FIG. 2 (or DIE2), from the first control logic block 202 of FIG. 2 (or DIE1), via the first (PWM) coupling channel 210 or over the second (DATA IN) coupling channel 212 of FIG. 2. Further for example, falling edges 508 (or, alternatively, leading edges 510) of the first Manchester encoded signal 502 can be considered the request ADC commands. Additionally, the signal to be converted is listed within the first Manchester encoded signal 502. Stated in another manner, the first Manchester encoded signal 502 sends or communicates a request ADC command to DIE2 (the HV side die) and within this request ADC command, the signal to be converted is listed.

By comparison, the second Manchester encoded signal 504 can be considered to represent the periodic sending of ADC results from the HV side 132 of the isolation system 102 back to the LV side 130 of the isolation system, which occurs in response to the receiving of the request ADC commands associated with the first Manchester encoded signal 502. Stated in another manner, the second Manchester encoded signal 504 serves to return the ADC result for the signal that was selected in the request ADC command provided by way of the first Manchester encoded signal 502. The second Manchester encoded signal 504 can for example be a signal received at the first control logic block 202 of FIG. 2 (or DIE1), from the second control logic block 204 of FIG. 2 (or DIE2) after being provided from the ADC block 206, via the third (DATA OUT) coupling channel 214 of FIG. 2. In this dual configuration mode, the different pulses of the second Manchester encoded signal 504 can represent the two different types of data received from the ADC block 206, namely, both the sensed DC Link (e.g., DC Link+ or DC Link−) input voltage information and also sensed temperature information regarding the temperature of an associated one of the transistor devices 134 or 136. For example, in the embodiment of FIG. 5, a first pulse 512 can send sensed temperature (e.g., IGBT die temperature) information, a second pulse 514 can send sensed DC Link input voltage information (e.g., information concerning the voltage received at the ADC IN or AMUX pin of the ADC block 206), and a third pulse 516 can again send sensed temperature (again, e.g., IGBT die temperature) information.

As for the PWM signal 506, this signal can be considered to represent the periodic sending of AOUT signals indicative of the ADC results, from the LV side 130 of the isolation system 102 to the microprocessor 104 in accordance with the step 320 of FIG. 3. The PWM signal 506 can for example be a signal received at the microprocessor 104 from the third terminal 234 corresponding to the AOUT pin of the first control logic block 202 of FIG. 2 (or DIE1) via the connection 156. In the present example, the PWM signal 506 can be determined (e.g., by the first control logic block 202) to be a multiplexed signal in which the sensed DC Link (e.g., DC Link+ or DC Link−) input voltage information and also sensed temperature information are provided at different frequencies (or periods) and multiplexed with one another. Further for example, the PWM signal 506 as illustrated includes first, second, and third pulses 518, 520, and 522, respectively, which correspond to the first, second, and third pulses 512, 514, and 516 of the second Manchester encoded signal 504, respectively, and which respectively contain sensed temperature information, sensed DC Link input voltage information, and sensed temperature information, respectively. It should also be appreciated that, for time periods 524 after each of the pulses 512 and 514 (and 516, although not shown) the ADC converts the results received at the ADC IN (or AMUX) pin of the ADC block 206.

In at least some embodiments, the different types of sensed information provided by the PWM signal 506 that are multiplexed can have different frequencies. For example, the PWM signal 506 can include sensed temperature (e.g., IGBT die temperature) information provided as a 4 kHz PWM signal component, and also include sensed DC Link (DC Link+ or DC Link−) input voltage information (e.g., as applied to the ADC IN or AMUX pin of the ADC block 206) provided as a 6 kHZ PWM signal component. Alternatively, the different types of sensed information signal components can have different duty cycles rather than (or in addition to) having different frequencies. Also in at least some embodiments, operation in the dual configuration mode involves setting weights for each signal component relative to one another. For example, although FIG. 5 shows signals components for which the different signal components corresponding to the sensed DC Link input voltage information and sensed temperature information are weighted equally (e.g., 1:1), in other embodiments the signal components corresponding to the two different types of sensed information can have different weightings. For example, in some such other embodiments, the ratio of the weightings of the sensed DC Link input voltage information signal component to the sensed temperature information signal component could be a ratio of any of 1:2, 1:4, or 1:8 (or 8:1, 4:1, or 2:1).

Notwithstanding the above discussion concerning single or dual configurations, it should also be appreciated that in still additional embodiments there can be triple or higher-order configurations in which three or more different types of information are communicated between the isolation system 102 and the microprocessor 102. Also, it should be appreciated that, although the connections described above (e.g., the connections 108, 110, 112 150, 152, 154, 156, 158, 160, 238, 240, 248) in the present embodiment are direct electrical connections, it should be appreciated that the present disclosure is intended to encompass numerous alternate embodiments in which one or more of these connections take other forms, including any of a variety of different types of direct or indirect connections, linkages, communications links, signal pathways, or other links.

Indeed, the present disclosure is intended to encompass numerous embodiments. In at least some example embodiments, the present disclosure relates to an isolation system. The isolation includes a first low voltage (LV) circuit portion including a first control logic portion, a first high voltage (HV) circuit portion including a second control logic portion and an analog-to-digital converter portion, and one or more coupling channels coupling the first LV and HV circuit portions by way of a galvanic barrier. The isolation system further includes a first transistor device having a first terminal coupled at least indirectly to a first connection having a first voltage level and a second terminal coupled at least indirectly to a second connection having a second voltage level related to the first voltage level, where the second terminal is coupled at least indirectly to a first port of the analog-to-digital converter portion. Additionally, the first control logic portion governs provision of an output signal from an output terminal of the isolation system for receipt by another device, the output signal being generated based at least indirectly upon the second voltage level and being indicative of the first voltage level. Further, due to the galvanic barrier, the output signal can be provided for receipt by the other device in a manner that avoids exposure of the other device to an undesirably high current or power level associated with the first HV circuit portion or the first transistor device.

Additionally, in at least some such embodiments of the isolation system, the LV and HV circuit portions, the one or more coupling channels, and the galvanic barrier are formed on an integrated circuit. Also, in at least some such embodiments, the integrated circuit is an isolated gate driver integrated circuit. Further, in at least some such embodiments, the transistor device is coupled to the integrated circuit by way of at least one resistor, and both the transistor device and the at least one resistor are components external to the integrated circuit. Additionally, in at least some such embodiments, the at least one resistor includes a first resistor, where the second terminal is coupled to the first port by way of the first resistor, and the first port is additionally coupled to the first connection by way of a second resistor, where the first and second resistors form a resistor divider circuit that is external of the integrated circuit. Further, in at least some such embodiments, the one or more coupling channels include a pulse-width modulation (PWM) coupling channel, a data in coupling channel, a data out coupling channel, and an interrupt coupling channel Additionally, in at least some such embodiments, the output signal is a pulse-width modulation (PWM) signal, where the first control logic portion is configured to determine one or both of a duty cycle or a frequency of the output signal.

Further, in at least some such embodiments, the isolation system also includes a temperature sensing component positioned proximate the first transistor device and coupled at least indirectly to a second port of the analog-to-digital converter portion, where the temperature sensing component is configured to provide a signal to the second port that is indicative of a temperature of at least a portion of the first transistor device or a region proximate to the first transistor device. Additionally, in at least some such embodiments, the first control logic portion is configured to adjust one or both of the duty cycle or the frequency of the output signal to allow for multiplexed communication of the output signal so that the output signal is, at least at different times, indicative of each of the first voltage level and the temperature. Further, in at least some such embodiments, the first control logic portion is configured so that the output signal includes a first component having a first frequency that is indicative of the voltage level and a second component having a second frequency that is indicative of the temperature. Also, in at least some such embodiments, one or both of the second control logic portion and the analog-to-digital converter portion is or are configured to cause one or both of processing or conversion of an input value or input signal received at the first port to be deferred until after a first time delay has elapsed since an occurrence of a change in a pulse-width modulation (PWM) control signal received at the first control logic portion or provided by the first control logic portion for receipt by the second control logic portion. Further, in at least some such embodiments, the second control logic portion is further configured to defer sending a data out signal based upon the processing or conversion of the input value or input signal until the second control logic portion receives a request analog-to-digital conversion signal from the first control logic portion. Additionally, in at least some such embodiments, the first transistor device is an insulated-gate bipolar transistor (IGBT).

Further, in at least some such embodiments, the isolation system also includes a second LV circuit portion including an additional first control logic portion, a second HV circuit portion including an additional second control logic portion and an additional analog-to-digital converter portion, and one or more coupling channels coupling the second LV and HV circuit portions by way of a galvanic barrier. Additionally, the isolation system further includes a second transistor device having an additional first terminal coupled at least indirectly to a third connection having a third voltage level and an additional second terminal coupled at least indirectly to the second connection, wherein the additional second terminal is coupled at least indirectly to an additional first port of the additional analog-to-digital converter portion. Also, in at least some embodiments, the present disclosure relates to a control system including the isolation system, where the control system additionally includes a microprocessor coupled at least indirectly to the LV circuit portion of the isolation system, the microprocessor being the other device, where the microprocessor is configured to provide one or more input signals for receipt at the LV circuit portion and to receive the output signal. Further, in at least some embodiments, the present disclosure relates to a system including the isolation system of claim 1 and additionally including a controlled device that is coupled at least indirectly to two or more of the first, second, and third connections, where the controlled device is either a motor controller or an inverter.

Additionally, in at least some further embodiments, the present disclosure relates to a method of monitoring a voltage level in an isolated manner. The method includes receiving a first pulse-width modulation (PWM) signal that transitions between low and high levels at a first time. The method also includes, upon an expiration of a first time delay subsequent to the first time, performing an analog-to-digital conversion of a first input signal or first input value that is received, at least indirectly from a first terminal of a first transistor device, by a first input port of an analog-to-digital converter portion of a high voltage (HV) circuit portion of an isolation system so as to generate a result signal. Further, the method additionally includes, upon receiving a request signal from a low voltage (LV) circuit portion of the isolation system at the HV circuit portion, sending the result signal or a further signal based upon the result signal across a galvanic barrier by way of a coupling channel to the LV circuit portion. Also, the method includes determining one or both of a duty cycle and a frequency of a second PWM signal to be output from the LV circuit portion for receipt by another device, where the second PWM signal is based upon the result signal and indicative of the first input signal or first input value. Additionally, the method includes sending the second PWM signal for receipt by the other device where, due to the galvanic barrier, the second PWM signal can be provided for receipt by the other device in a manner that avoids exposure of the other device to an undesirably high current or power level associated with the HV circuit portion or the first transistor device.

Further, in at least some such embodiments, the method additionally includes receiving a second input signal or second input value, at least indirectly provided from a temperature sensor, by a second input port of the analog-to-digital converter portion, and determining an adjustment to one or both of the duty cycle and the frequency of the second PWM signal so that the second PWM signal, when sent for receipt by the other device, can be indicative of the first input signal or first input value at least at a first time and can be indicative of second input signal or second input value at least at a second time. Additionally, in at least some such embodiments, the determining of the one or both of the duty cycle and the frequency of the second PWM signal is performed by a first control logic circuit portion of the LV circuit portion, where the first terminal of the first transistor device is coupled to the first port of the analog-to-digital converter by way of a first resistor, where a second terminal of the first transistor device is coupled to the first port of the analog-to-digital converter by way of a second resistor, where the first and second resistors form a resistor divider, where the first terminal is coupled to a phase connection and the second terminal is coupled to a DC link connection.

Additionally, in at least some further example embodiments, the present disclosure relates to a control system for a high-power device. The control system includes a controller configured to transmit and receive low voltage signals, and an integrated circuit coupled to the controller, the integrated circuit comprising. The control system also includes a first low voltage (LV) circuit portion including a first control logic portion, and a first high voltage (HV) circuit portion including a second control logic portion and an analog-to-digital converter portion. The control system further includes one or more coupling channels coupling the first LV and HV circuit portions by way of a galvanic barrier. Also, the control system includes a first transistor device having a first terminal coupled at least indirectly to a first connection having a first voltage level and a second terminal coupled at least indirectly to a second connection having a second voltage level related to the first voltage level, where the second terminal is coupled at least indirectly to a first port of the analog-to-digital converter portion. Further, the first control logic portion governs provision of an output signal from an output terminal of the integrated circuit for receipt by the controller, the output signal being generated based at least indirectly upon the second voltage level and being indicative of the first voltage level. Also, due to the galvanic barrier, the output signal can be provided for receipt by the controller in a manner that avoids exposure of the other device to an undesirably high current or power level associated with the first HV circuit portion or the first transistor device.

While the principles of the invention have been described above in connection with specific apparatus, it is to be clearly understood that this description is made only by way of example and not as a limitation on the scope of the invention. It is specifically intended that the present invention not be limited to the embodiments and illustrations contained herein, but include modified forms of those embodiments including portions of the embodiments and combinations of elements of different embodiments as come within the scope of the following claims.

What is claimed is:

1. An isolation system comprising:
a first low voltage (LV) circuit portion including a first control logic portion;
a first high voltage (HV) circuit portion including a second control logic portion and an analog-to-digital converter portion;
one or more coupling channels coupling the first LV and HV circuit portions by way of a galvanic barrier; and
a first transistor device having a first terminal coupled at least indirectly to a first connection having a first voltage level and a second terminal coupled at least indirectly to a second connection having a second voltage level related to the first voltage level,
wherein the second terminal is coupled at least indirectly to a first port of the analog-to-digital converter portion,
wherein the first control logic portion governs provision of an output signal from an output terminal of the isolation system for receipt by another device, the output signal being generated based at least indirectly upon the second voltage level and being indicative of the first voltage level, and
wherein, due to the galvanic barrier, the output signal can be provided for receipt by the other device in a manner that avoids exposure of the other device to an undesirably high current or power level associated with the first HV circuit portion or the first transistor device.

2. The isolation system of claim 1, wherein the LV and HV circuit portions, the one or more coupling channels, and the galvanic barrier are formed on an integrated circuit.

3. The isolation system of claim 2, wherein the integrated circuit is an isolated gate driver integrated circuit.

4. The isolation system of claim 2, wherein the transistor device is coupled to the integrated circuit by way of at least one resistor, and both the transistor device and the at least one resistor are components external to the integrated circuit.

5. The isolation system of claim 4, wherein the at least one resistor includes a first resistor, wherein the second terminal is coupled to the first port by way of the first resistor, and wherein the first port is additionally coupled to the first connection by way of a second resistor, wherein the first and second resistors form a resistor divider circuit that is external of the integrated circuit.

6. The isolation system of claim 4, wherein the one or more coupling channels include a pulse-width modulation (PWM) coupling channel, a data in coupling channel, a data out coupling channel, and an interrupt coupling channel.

7. The isolation system of claim 1, wherein the output signal is a pulse-width modulation (PWM) signal, and wherein the first control logic portion is configured to determine one or both of a duty cycle or a frequency of the output signal.

8. The isolation system of claim 7, further comprising a temperature sensing component positioned proximate the first transistor device and coupled at least indirectly to a second port of the analog-to-digital converter portion, wherein the temperature sensing component is configured to provide a signal to the second port that is indicative of a temperature of at least a portion of the first transistor device or a region proximate to the first transistor device.

9. The isolation system of claim 8, wherein the first control logic portion is configured to adjust one or both of the duty cycle or the frequency of the output signal to allow for multiplexed communication of the output signal so that the output signal is, at least at different times, indicative of each of the first voltage level and the temperature.

10. The isolation system of claim 9, wherein the first control logic portion is configured so that the output signal includes a first component having a first frequency that is indicative of the voltage level and a second component having a second frequency that is indicative of the temperature.

11. The isolation system of claim 1, wherein one or both of the second control logic portion and the analog-to-digital converter portion is or are configured to cause one or both of processing or conversion of an input value or input signal received at the first port to be deferred until after a first time delay has elapsed since an occurrence of a change in a pulse-width modulation (PWM) control signal received at the first control logic portion or provided by the first control logic portion for receipt by the second control logic portion.

12. The isolation system of claim 11, wherein the second control logic portion is further configured to defer sending a data out signal based upon the processing or conversion of the input value or input signal until the second control logic portion receives a request analog-to-digital conversion signal from the first control logic portion.

13. The isolation system of claim 1, wherein the first transistor device is an insulated-gate bipolar transistor (IGBT).

14. The isolation system of claim 1, further comprising:
a second LV circuit portion including an additional first control logic portion;
a second HV circuit portion including an additional second control logic portion and an additional analog-to-digital converter portion;
one or more coupling channels coupling the second LV and HV circuit portions by way of a galvanic barrier; and
a second transistor device having an additional first terminal coupled at least indirectly to a third connection having a third voltage level and an additional second terminal coupled at least indirectly to the second connection,
wherein the additional second terminal is coupled at least indirectly to an additional first port of the additional analog-to-digital converter portion.

15. A control system comprising the isolation system of claim 1, wherein the control system additionally includes a microprocessor coupled at least indirectly to the LV circuit portion of the isolation system, the microprocessor being the other device, wherein the microprocessor is configured to provide one or more input signals for receipt at the LV circuit portion and to receive the output signal.

16. A system comprising the isolation system of claim 1 and additionally including a controlled device that is coupled at least indirectly to two or more of the first, second, and third connections, wherein the controlled device is either a motor controller or an inverter.

17. A method of monitoring a voltage level in an isolated manner, the method comprising:
receiving a first pulse-width modulation (PWM) signal that transitions between low and high levels at a first time;
upon an expiration of a first time delay subsequent to the first time, performing an analog-to-digital conversion of a first input signal or first input value that is received, at least indirectly from a first terminal of a first transistor device, by a first input port of an analog-to-digital converter portion of a high voltage (HV) circuit portion of an isolation system so as to generate a result signal;
upon receiving a request signal from a low voltage (LV) circuit portion of the isolation system at the HV circuit portion, sending the result signal or a further signal based upon the result signal across a galvanic barrier by way of a coupling channel to the LV circuit portion;
determining one or both of a duty cycle and a frequency of a second PWM signal to be output from the LV circuit portion for receipt by another device, wherein the second PWM signal is based upon the result signal and indicative of the first input signal or first input value; and
sending the second PWM signal for receipt by the other device,
wherein, due to the galvanic barrier, the second PWM signal can be provided for receipt by the other device in a manner that avoids exposure of the other device to an undesirably high current or power level associated with the HV circuit portion or the first transistor device.

18. The method of claim 17, further comprising:
receiving a second input signal or second input value, at least indirectly provided from a temperature sensor, by a second input port of the analog-to-digital converter portion;
determining an adjustment to one or both of the duty cycle and the frequency of the second PWM signal so that the second PWM signal, when sent for receipt by the other device, can be indicative of the first input signal or first input value at least at a first time and can be indicative of second input signal or second input value at least at a second time.

19. The method of claim 18, wherein the determining of the one or both of the duty cycle and the frequency of the second PWM signal is performed by a first control logic circuit portion of the LV circuit portion, wherein the first terminal of the first transistor device is coupled to the first port of the analog-to-digital converter by way of a first resistor, wherein a second terminal of the first transistor device is coupled to the first port of the analog-to-digital converter by way of a second resistor, wherein the first and second resistors form a resistor divider, wherein the first terminal is coupled to a phase connection and the second terminal is coupled to a DC link connection.

20. A control system for a high-power device, the control system comprising:
a controller configured to transmit and receive low voltage signals;
an integrated circuit coupled to the controller, the integrated circuit comprising:
a first low voltage (LV) circuit portion including a first control logic portion;
a first high voltage (HV) circuit portion including a second control logic portion and an analog-to-digital converter portion; and
one or more coupling channels coupling the first LV and HV circuit portions by way of a galvanic barrier; and
a first transistor device having a first terminal coupled at least indirectly to a first connection having a first voltage level and a second terminal coupled at least indirectly to a second connection having a second voltage level related to the first voltage level,
wherein the second terminal is coupled at least indirectly to a first port of the analog-to-digital converter portion,
wherein the first control logic portion governs provision of an output signal from an output terminal of the integrated circuit for receipt by the controller, the output signal being generated based at least indirectly upon the second voltage level and being indicative of the first voltage level, and
wherein, due to the galvanic barrier, the output signal can be provided for receipt by the controller in a manner that avoids exposure of the other device to an undesirably high current or power level associated with the first HV circuit portion or the first transistor device.

* * * * *